United States Patent
Nam et al.

(10) Patent No.: US 8,198,102 B2
(45) Date of Patent: Jun. 12, 2012

(54) METHODS OF FABRICATING MAGNETIC MEMORY DEVICES WITH THIN CONDUCTIVE BRIDGES

(75) Inventors: KyungTae Nam, Gyeonggi-do (KR);
Jangeun Lee, Gyeonggi-do (KR);
Sechung Oh, Gyeonggi-do (KR);
Woojin Kim, Gyeonggi-do (KR); Dae Kyom Kim, Daejeon (KR); Junho Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 326 days.

(21) Appl. No.: 12/539,747

(22) Filed: Aug. 12, 2009

(65) Prior Publication Data
US 2010/0041168 A1 Feb. 18, 2010

(30) Foreign Application Priority Data

Aug. 18, 2008 (KR) ......................... 10-2008-0080508

(51) Int. Cl.
*H01L 21/00* (2006.01)
(52) U.S. Cl. .................. 438/3; 365/66; 365/97; 365/98; 365/99; 365/171; 365/173; 257/295; 257/421; 257/422
(58) Field of Classification Search ...... 438/3; 257/295, 257/421, 422; 365/66, 97–99, 171, 173
See application file for complete search history.

(56) References Cited

U.S. PATENT DOCUMENTS

| 5,715,121 | A | * | 2/1998 | Sakakima et al. | ......... 360/324.2 |
| 6,686,068 | B2 | * | 2/2004 | Carey et al. | ................ 428/811.3 |
| 7,161,829 | B2 | | 1/2007 | Huai et al. | |
| 7,423,851 | B2 | | 9/2008 | Sbiaa | |
| 7,672,086 | B1 | * | 3/2010 | Jiang | ........................ 360/324.1 |
| 2003/0123200 | A1 | * | 7/2003 | Nagasaka et al. | .......... 360/324.1 |
| 2006/0077596 | A1 | * | 4/2006 | Yuasa et al. | ................ 360/324.1 |
| 2007/0188945 | A1 | * | 8/2007 | Fuji et al. | ................. 360/324.12 |
| 2009/0162698 | A1 | * | 6/2009 | Fukuzawa et al. | ......... 428/811.2 |

FOREIGN PATENT DOCUMENTS

| JP | 2005-109499 | 4/2005 |
| JP | 2007-096105 | 4/2007 |
| KR | 1020060069879 A | 6/2006 |

OTHER PUBLICATIONS

Meng, et al.; *Spin Transfer Effect in Magnetic Tunnel Junction with a Nano-Current-Channel Layer in Free Layer*; IEEE Transactions on Magnetics, vol. 41, No. 10; pp. 2612-2614; (Oct. 2005).
Myers et al.; *Spin Torque and Magnetic Tunnel Junctions*; Cornell University; Kavli Institute for Theoretical Physics, Spintronics (Conference) (Mar. 20, 2006).

* cited by examiner

*Primary Examiner* — Bac Au
(74) *Attorney, Agent, or Firm* — Myers Bigel Sibley & Sajovec, P.A.

(57) ABSTRACT

A magnetic memory device includes a free layer and a guide layer on a substrate. An insulating layer is interposed between the free layer and the guide layer. At least one conductive bridge passes through the insulating layer and electrically connects the free layer and the guide layer. A diffusion barrier may be interposed between the guide layer and the insulating layer. The device may further include a reference layer having a fixed magnetization direction on a side of the free layer opposite the insulating layer and a tunnel barrier between the reference layer and the free layer. Related fabrication methods are also described.

13 Claims, 5 Drawing Sheets

METHODS OF FABRICATING MAGNETIC MEMORY DEVICES WITH THIN CONDUCTIVE BRIDGES

CROSS-REFERENCE TO RELATED APPLICATIONS

This U.S. non-provisional patent application claims the priority under 35 U.S.C. §119 of Korean Patent Application No. 10-2008-0080508, filed on Aug. 18, 2008, the entire contents of which are hereby incorporated by reference.

BACKGROUND

The present invention relates to memory devices and methods of fabricating the same and, more particularly, to magnetic memory devices and methods of fabricating the same.

As a consequence of the trend of higher speed and low power consumption in electronic devices, it has become desirable that memory devices embedded therein provide speedy read/write operation and low operation voltage. In order to meet this demand, magnetic memory devices have been developed. Magnetic memory devices are drawing increasing attention as candidates for next-generation memory having high-speed operation and/or non-volatile characteristics.

A typical conventional magnetic memory device may include a Magnetic Tunnel Junction (MTJ) pattern. An MTJ pattern typically includes two magnetic substance layers and an insulating layer interposed therebetween and may have a resistance value that varies in accordance with the magnetization direction of two magnetic substance layers. Typically, when the magnetization directions of two magnetic substances are aligned antiparallel (i.e., in parallel, but opposite, directions), the MTJ pattern may have a greater resistance value. When the magnetization directions of the two magnetic substance layers are parallel, the MTJ pattern may have a lower resistance value. The difference between the resistance values enables data to be stored.

SUMMARY

Some embodiments of the present invention provide magnetic memory devices having a low switching current characteristic and methods of fabricating the same.

Some method embodiments include forming a free layer and an insulating layer on a substrate and moving a conductive element in the insulating layer to form at least one conductive bridge passing through the insulating layer and electrically connected to the free layer. The methods may further include forming a guide layer on a second side of the insulating layer opposite the free layer and electrically connected to the at least one conductive bridge. The free layer and the guide layer may each include at least one ferromagnetic material.

Forming a guide layer may include forming the guide layer on the substrate. Forming a free layer and an insulating layer on a substrate may include forming the insulating layer on the guide layer and forming the free layer on the insulating layer. A diffusion barrier may be formed between the guide layer and the insulating layer.

Forming a free layer and an insulating layer on a substrate may include forming the free layer on the substrate and forming the insulating layer on the free layer. Forming a guide layer may include forming the guide layer on the insulating layer.

In some embodiments, moving a conductive element in the insulating layer to form at least one conductive bridge passing through the insulating layer and electrically connected to the free layer may be preceded by forming a conductive layer including the conductive element on the insulating layer. Moving a conductive element in the insulating layer to form at least one conductive bridge passing through the insulating layer and electrically connected to the free layer may include moving the conductive element from the conductive layer to the insulating layer.

In some embodiments, moving a conductive element in the insulating layer to form at least one conductive bridge passing through the insulating layer and electrically connected to the free layer may include diffusing the conductive element into the insulating layer. In further embodiments, moving a conductive element in the insulating layer to form at least one conductive bridge passing through the insulating layer and electrically connected to the free layer may include applying a potential difference across the insulating layer.

In further embodiments, methods may include forming a reference layer having a fixed magnetization direction on a side of the free layer opposite the insulating layer and forming a tunnel barrier interposed between the reference layer and the free layer.

In additional embodiments of the present invention, a magnetic memory device includes a free layer and a guide layer on a substrate. An insulating layer is interposed between the free layer and the guide layer. At least one conductive bridge passes through the insulating layer and electrically connects the free layer and the guide layer. A diffusion barrier may be interposed between the guide layer and the insulating layer. The device may further include a reference layer having a fixed magnetization direction on a side of the free layer opposite the insulating layer and a tunnel barrier between the reference layer and the free layer.

BRIEF DESCRIPTION OF THE FIGURES

The accompanying figures are included to provide a further understanding of the present invention, and are incorporated in and constitute a part of this specification. The drawings illustrate embodiments of the present invention. In the figures.

DETAILED DESCRIPTION OF EMBODIMENTS

Figure 1:
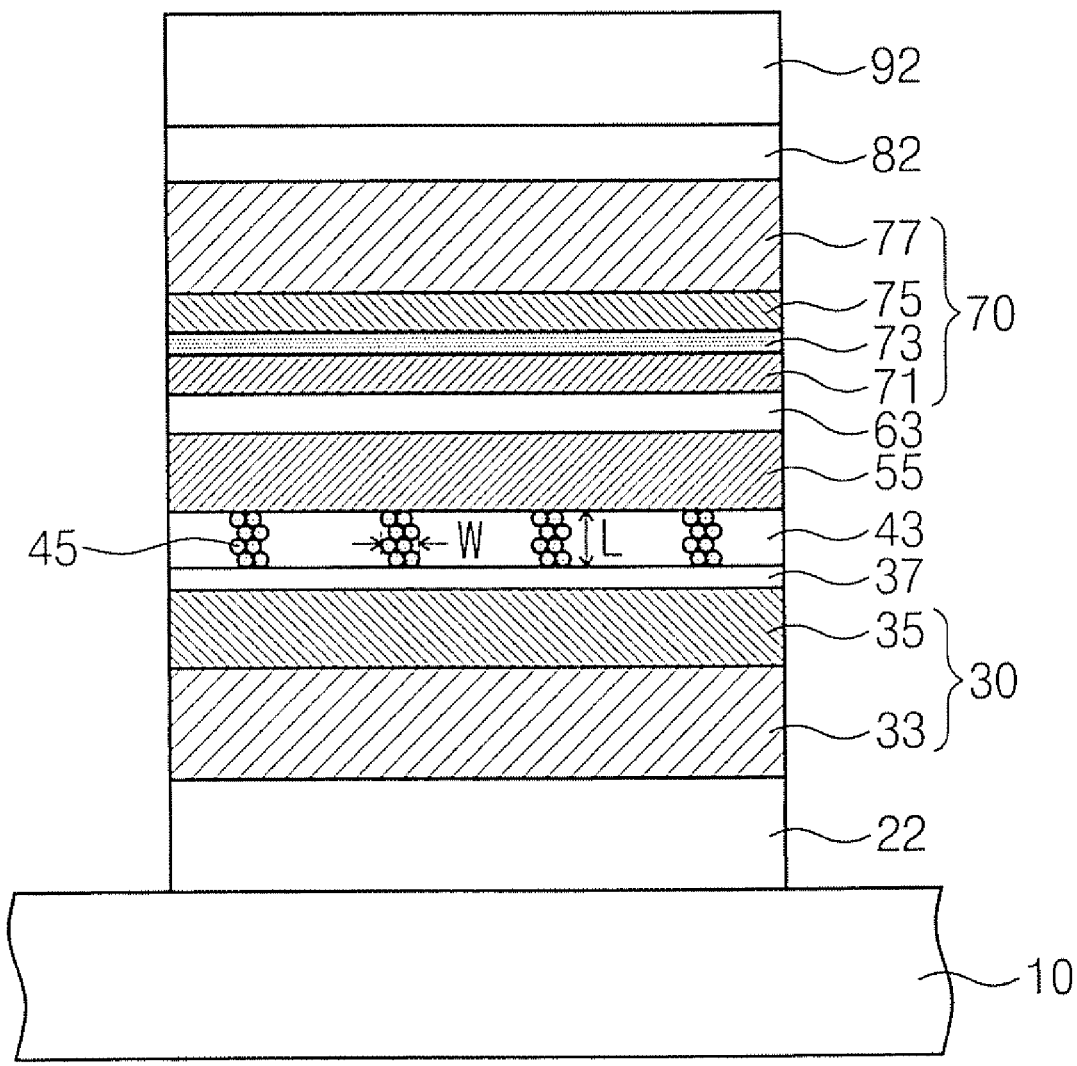
FIG. 1 is a diagram illustrating a magnetic memory device according to some embodiments of the present invention.

The present invention will now be described more fully hereinafter with reference to the accompanying drawings, in which embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

It will be understood that when an item (e.g., a component, region, layer, section, unit, module, device, circuit, etc.) is referred to as being on, connected to and/or coupled to another item, the item may be directly on, connected and/or coupled to the other item, or intervening items may be present. In contrast, when an item is referred to as being directly on, directly connected to and/or directly coupled to another item, no intervening items are present. As used herein, the term "and/or" includes any and all combinations of one or more of the associated listed items.

It will also be understood that, although the terms first, second, etc., may be used herein to describe various items, these items should not be limited by these terms. Rather, these terms are used merely as a convenience to distinguish one item from another item. For example, a "first" item could be termed a "second" item without departing from the teachings of the present invention.

Spatially relative terms, such as beneath, below, lower, above, upper, "top," "bottom" and the like, may be used to describe an item's relationship to another item as, for example, illustrated in the figures. It will be understood that the spatially relative terms are intended to encompass different orientations of the device in use and/or operation in addition to the orientation depicted in the figures. For example, when the device in the figures is turned over, items described as below and/or beneath other items would then be oriented above the other items. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprise," "comprising," includes, including, "have", "having" and variants thereof specify the presence of stated items, features, integers, steps, operations and the like, but do not preclude the presence and/or addition of one or more other items, features, integers, steps, operations and the like, or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from. e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the drawings, the thickness of layers and regions are exaggerated for clarity. It will also be understood that when an item such as a layer, region or substrate is referred to as being "on" or "onto" another item, it may lie directly on the other items or intervening items may also be present. Like reference numerals refer to like items throughout the specification.

Referring to FIG. 1, a first conductive pattern 22 may be disposed on a substrate 10. The substrate 10 may include a conductive region and/or an insulating region. The substrate 10 may be, for example, a silicon-based semiconductor substrate, but is not limited thereto. A guide layer 30, insulating layer 43, a free layer 53, and a reference layer 70 may be stacked on the first conductive pattern 22. The insulating layer 43 may include conductive bridges 45 therein.

The free layer 55 may include a ferromagnetic substance. For example, the free layer 55 may include CoFeB, Fe, Co, Ni, Gd, Dy, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$. The magnetization direction of the free layer 55 may vary between a first direction and a second direction opposite to the first direction. For example, the magnetization direction of the free layer 55 may be controlled by electrons provided from the reference layer 70 and/or the guide layer 30. The free layer 55 may be interposed between the guide layer 30 and the reference layer 70. The insulating layer 43 may be interposed between the guide layer 30 and the free layer 55.

The reference layer 70 may have a fixed magnetization direction. The reference layer 70 may serve as a reference for a read operation of a magnetic memory cell. The read operation of the magnetic memory cell may be performed by determining a difference between resistance values of a magnetic tunnel junction for respective conditions in which the magnetization directions of the reference layer 70 and the free layer 55 are parallel to each other. Upon a read operation of the magnetic memory cell, the reference layer 70 may control the spin direction of electrons provided to the free layer 55. For example, in order to control the spin direction of electrons provided to the free layer 55, the reference layer 70 may allow electrons having a parallel spin direction to the magnetic direction thereof to pass through, and vise versa.

The reference layer 70 may include a ferromagnetic substance. The reference layer 70 may be connected to the free layer 55 through a tunnel barrier 63. Electrons may move between the reference layer 70 and the free layer 55 by tunneling through the tunnel barrier 63.

For example, the reference layer 70 may include a reference magnetic layer 71, a non-magnetic layer 73, an auxiliary magnetic layer 75, and a reference pinning layer 77. The reference magnetic layer 71 may be adjacent to the tunnel barrier 63. In this case, the magnetization direction of the auxiliary magnetic layer 75 may be fixed by the reference pinning layer 77. The reference magnetic layer 71 may have a fixed magnetization direction opposite to the magnetization direction of the auxiliary magnetic layer 75 through the non-magnetic layer 73. In particular, the auxiliary magnetic layer 75 may have a magnetization direction antiparallel to the magnetization direction of the reference magnetic layer 71, so that an influence of the magnetization direction of the reference magnetic layer 71 on the free layer 55 may be reduced.

The reference magnetic layer 71 and the auxiliary magnetic layer 75 may include a ferromagnetic substance. For example, the reference magnetic layer 71 and the auxiliary magnetic layer 75 may include at least one of CoFeB, Fe, Co, Ni, Gd, Dy, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. The reference magnetic layer 71 and the auxiliary magnetic layer 75 may include identical materials or different materials.

The reference pinning layer 77 may include an anti-ferromagnetic substance. For example, the reference pinning layer 77 may include at least one of PtMn, IrMn, MnO, MnS, MnTe, $FeCl_2$, FeO, $CoCl_2$, CoO, $NiCl_2$, NiO, and Cr. The reference pinning layer 77 may fix the magnetization direction of the auxiliary magnetic layer 75.

The tunnel barrier 63 may be interposed between the reference layer 70 and the free layer 55. For example, the tunnel barrier 63 may include a magnesium oxide or an aluminum oxide. The tunnel barrier 63 may have a thickness that may be tunneled by electrons.

The guide layer 30 may include a layer having a fixed magnetic direction. For example, the guide layer 30 may include a guide magnetic layer 35 and a guide pinning layer 33. The guide magnetic layer 35 may include a ferromagnetic substance. The magnetic layer 35 may have a magnetization direction fixed by the guide pinning layer 33, which may include an anti-ferromagnetic substance. The guide magnetic layer 35 may allow electrons having a spin direction parallel to the magnetization direction of the guide magnetic layer 35 to pass through. Thus, a plurality of electrons provided in the free layer 55 through the guide magnetic layer 35 may have a spin direction identical to the magnetization direction of the guide magnetic layer 35.

The guide magnetic layer 35 may include, for example, at least one of CoFeB, Fe, Co, Ni, Gd, Dy, CoFe, MnAs, MnBi, MnSb, $CrO_2$, $MnOFe_2O_3$, $FeOFe\ O_3$, $NiOFe_2O_3$, $CuOFe_2O_3$, $MgOFe_2O_3$, EuO, and $Y_3Fe_5O_{12}$. The guide pinning layer 33 may include, for example, at least one of PtMn, IrMn, MnO, MnS, MnTe, $FeCl_2$, FeO, CoCl, CoO, $NiCl_2$, NiO, and Cr.

The insulating layer 43 may include, for example, an oxide, a nitride, a chalcogen compound, or a combination thereof. The insulating layer 43 may have an undensified crystalline structure.

The conductive bridges 45 may electrically connect the guide layer 30 to the free layer 55. The conductive bridges 45 may include a conductive element capable of moving in the insulating layer 43. The conductive element may have a standard reduction potential greater than that of hydrogen. For example, the conductive element may include at least one of Cu, Ag, Au, Pt, Ti, Ru, and Ir.

The conductive bridges 45 may have a relatively very small width. For example, the width W of the conductive bridges 45 may be less than several tens (i.e., less than 100) of atomic diameters of the conductive element. The width of the conductive bridges 45 may be as little as the diameter of the conductive element.

Because the width W of the conductive bridges 45 is very small, the current density passing the conductive bridges 45 may be increased. Accordingly, a relatively low switching current may be used for read operations of the magnetic memory cell. In some embodiments, the width W of the conductive bridges 45 may be less than several tens (i.e., less that about one hundred) atomic diameters of a conductive element. As a result, the quantity of the switching current may be kept relatively small, thereby realizing a low power magnetic memory device. Also, a reduction of power consumption can improve the integration of the magnetic memory device.

Distance between the guide layer 30 and the free layer 55 may be smaller than a spin diffusion length. The spin diffusion length is defined as a maximum length to which electrons can be diffused without a spin change. For example, the length L of the conductive bridges 45, i.e., the distance between the guide layer 30 and the free layer 55 connected by the conductive bridges 45, may be smaller than the spin diffusion length. Accordingly, when electrons move between the guide layer 30 and the free layer 55, electrons may move without a change of spin direction.

A diffusion barrier 37 may be further interposed between the insulating layer 43 and the guide layer 30. The diffusion barrier 37 can prevent a diffusion of the conductive element in the conductive bridges 45. The diffusion barrier 37 may include a conductive material having a low solubility with respect to the conductive element. For example, the diffusion barrier 37 may include at least one of Co, Cr, Ru, Ta, and Ir. When the diffusion barrier 37 exists, the sum of the length L of the conductive bridges 45 and the thickness of the diffusion barrier 37 may be smaller than the spin diffusion length.

Hereinafter, operations for programming a magnetic memory device according to some embodiments of the present invention will be described in detail with reference to FIG. 1. Referring again to FIG. 1, the guide layer 30 may include a layer having a fixed magnetization direction. For example, the guide layer 30 may include a guide magnetic layer 35 having a magnetization direction fixed in a first direction. The magnetization direction of the free layer 55 may vary. The reference layer 70 on the free layer 55 may include a layer having a fixed magnetization direction. For example, the reference layer 70 may include a reference magnetic layer 71 having a magnetization direction fixed in the first direction. In this case, the auxiliary magnetic layer 75 may have a second magnetization direction. The non-magnetic layer 73 may fix the magnetization direction of the reference magnetic layer 71 to have opposite to the magnetization direction of the auxiliary magnetic layer 75

Hereinafter, a first programming procedure will be in detail described. A current may be applied so as to flow from the first conductive pattern 22 to the first conductive pattern 22, that is, electrons may flow from the first conductive pattern 22 to the second conductive pattern 92. The electrons may include electrons having a first directional spin and a second directional spin. The electrons may pass through the guide pinning layer 33 and the guide magnetic layer 35. Electrons that have passed through the guide magnetic layer 35 may include a majority of electrons having the first directional spin and a minority of electrons having the second directional spin.

The majority of electrons and the minority of electrons may move into the reference magnetic layer 71 through the conductive bridges 45, the free layer 55, and the tunnel barrier layer 63. As the reference magnetic layer 71 has the first magnetization direction, the majority of electrons may pass through the reference magnetic layer 71. However, the minority of electrons may not pass through the reference magnetic layer 71, and may be accumulated in the free layer 55. The tunnel barrier 63 may assist accumulation of the minority of electrons in the free layer 55. The accumulated electrons may deliver the spin of the second direction to the free layer 55. Through a spin-torque transfer mechanism, the magnetization direction of the free layer 55 may be changed to the second direction. Thus, the free layer 55 thereby takes on the second magnetization direction. In this case, because the magnetization directions of the reference magnetic layer 71 and the free layer 55 are antiparallel, the magnetic tunnel junction including the reference magnetic layer 71 and the free layer 55 may have a higher resistance value.

Hereinafter, a second programming procedure will be in detail described. A current for the second programming procedure may be applied in a direction opposite to the current direction of the first programming procedure. That is, electrons may flow from the second conductive pattern 92 to the first conductive pattern 22. The electrons may include electrons having the first directional spin and the second directional spin. The electrons may move to the reference magnetic layer 71 through the reference pinning layer 77. The electrons that have passed through the reference magnetic layer 71 may include a majority of electrons having the first directional spin and a minority of electrons having the second directional spin.

The majority of electrons may deliver the first directional spin to the free layer 55 through the tunnel barrier 63. Thus, the free layer 55 may take on the first magnetization direction. The minority of electrons may move to the guide layer 30 via the conductive bridges 45. That is, the minority of electrons may not be accumulated in the free layer 55. Accordingly, the free layer 55 may have the first magnetization direction parallel to that of the reference magnetic layer 71. The magnetic tunnel junction including the reference magnetic layer 71 and the free layer 55 having the second magnetization direction may have a resistance value lower than that of the magnetic tunnel junction in the first programming procedure. In this manner, data may be stored in the magnetic memory cell.

Another programming procedure of a magnetic memory cell according to embodiments of the present invention will be described in detail with reference to FIG. 1.

The guide layer 30 may include a layer having a first magnetization direction. For example, the guide layer 30 may include a guide magnetic layer 35 magnetized in the first direction. The guide layer 70 may have a fixed magnetization direction, while including a layer having a magnetization direction antiparallel to the guide magnetic layer 35. For example, the reference magnetic layer 71 of the reference layer 70 may have a second magnetization direction antiparallel to the first magnetization direction. In this case, the auxiliary magnetic layer 75 may have the first magnetization direction.

A first programming procedure will be described when the guide layer 30 has a magnetization direction fixed in the first direction, and the reference layer 70 has a magnetization direction fixed in the second direction. A current may be applied in a direction from the second conductive pattern 92 to the first conductive pattern 22. Electrons may move in a direction from the first conductive pattern 22 to the second conductive pattern 92. The electrons may include electrons having a first directional spin and electrons having a second directional spin antiparallel to the first direction. The electrons may pass through the guide magnetic layer 35 having a first magnetization direction. The electrons that have passed through the guide magnetic layer 35 may include a majority of electrons having a first directional spin and a minority of electrons having a second directional spin. The electrons that have passed the guide magnetic layer 35 may be provided to the reference magnetic layer 71 through the conductive bridges 34 and the free layer 55.

Because the majority of electrons have spin oppositely parallel to the magnetization direction of the reference magnetic layer 71, the majority of electrons may not pass through the reference magnetic layer 71. The majority of electrons that have not passed through the reference magnetic layer 71 may be accumulated in the free layer 55. In this case, the tunnel barrier 63 may contribute to the accumulation of the electrons in the free layer 63. The majority of electrons accumulated in the free layer 55 may deliver the first directional spin to the free layer 55. Accordingly, the free layer 55 may have the first magnetization direction. Because the magnetization direction of the free layer 55 is antiparallel to the magnetization direction of the reference magnetic layer 71, the resistance value of the magnetic tunnel junction may be higher.

A first programming procedure will be described when the guide layer 30 has a magnetization direction fixed in the first direction, and the reference layer 70 has a magnetization direction fixed in the second direction. A current may be applied in a direction from the first conductive pattern 22 to the second conductive pattern 92. Electrons may move in a direction from the first conductive pattern 92 to the second conductive pattern 22. The electrons provided through the second conductive pattern 92 may pass through the reference magnetic layer 71 via the reference pinning layer 77, the auxiliary magnetic layer 75, and the non-magnetic layer 73. The electrons that have passed the reference magnetic layer 71 may include a majority of electrons having a second directional spin and a minority of electrons having a first directional spin. The majority of electrons may deliver the second directional spin to the free layer 55. Accordingly, the free layer 55 may take on the second magnetization direction. Because the magnetization direction of the reference magnetic layer 71 is parallel to the magnetization direction of the free layer 55, the resistance value of the magnetic tunnel junction may be lower than that of the first programming procedure. The difference between the resistance values may allow data to be stored in the magnetic memory cell.

Figure 2:
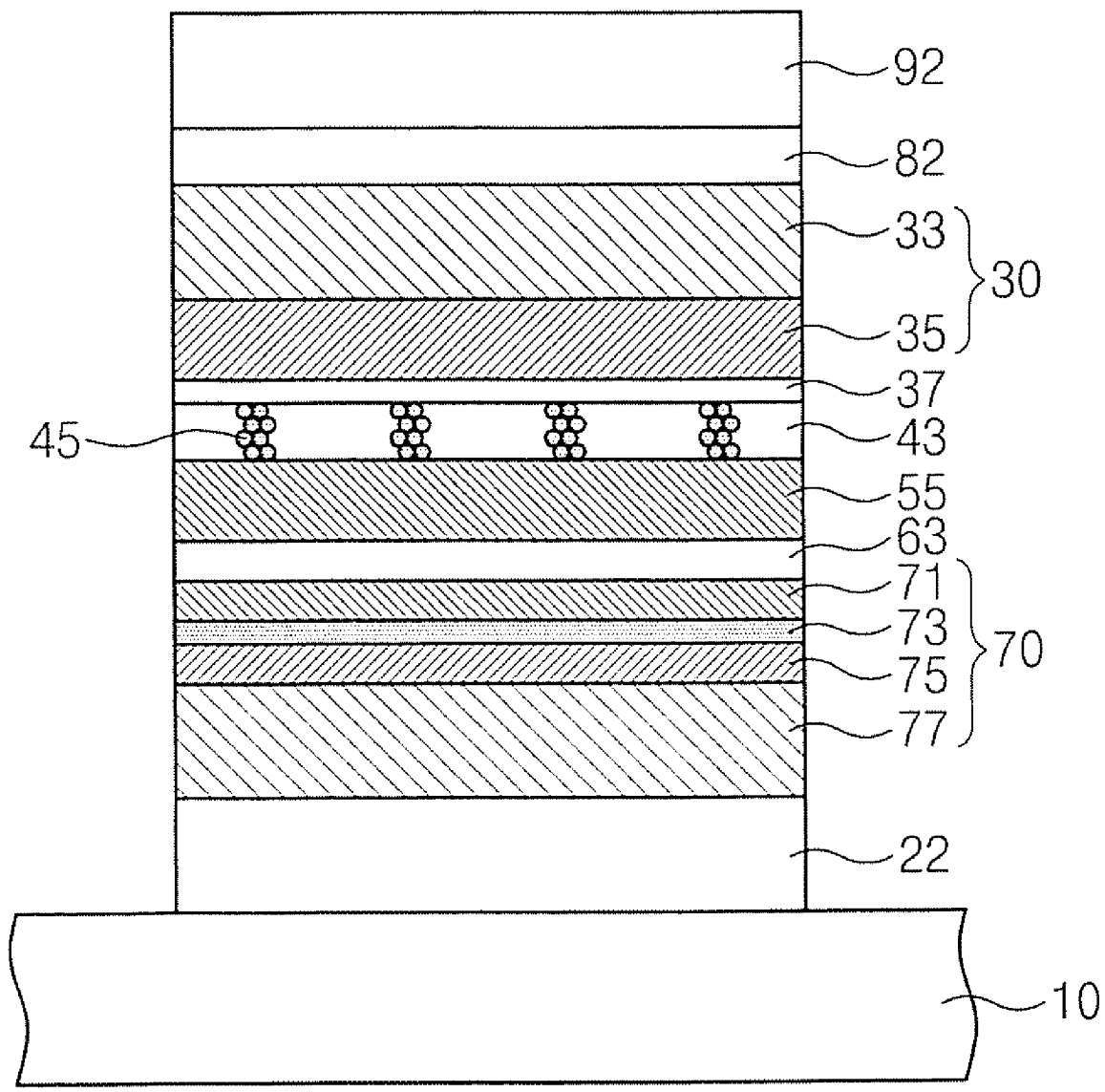
FIG. 2 is a diagram illustrating a magnetic memory device according to further embodiments of the present invention.

In the magnetic memory device as described in FIG. 1, the guide layer 30 is disposed under the free layer 55, and the reference layer 70 is disposed on the free layer 55. The guide layer 30, the free layer 55 and the reference layer 70 may be stacked in a different form, which is hereinafter described with reference to FIG. 2. A first conductive pattern 22 may be provided on a substrate 10. A reference layer 70, a tunnel barrier 63, a free layer 55, an insulating layer 43 including conductive bridges 45 therein, and a guide layer 30 may be stacked on the first conductive pattern 22. Unlike the embodiment in FIG. 1, a diffusion barrier 37 is interposed between the insulating layer 43 and the guide layer 30. Also, a capping layer 82 and a second conductive pattern 92 may be disposed on the guide layer 30.

The reference layer 70 may include a reference pinning layer 77, an auxiliary magnetic layer 75, a non-magnetic layer 73 and a reference magnetic layer 71. The guide layer 30 may include a guide pinning layer 33 and a guide magnetic layer 35 stacked on the insulating layer 43. The magnetic memory device in FIG. 2 may be programmed using operations similar to those described above with reference to FIG. 1.

Figure 3:
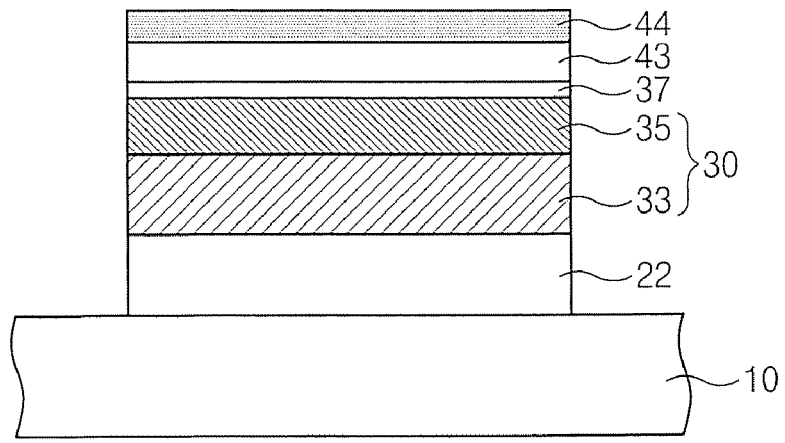
FIGS. 3 through 5 are diagrams illustrating operations for forming a magnetic memory device according to some embodiments of the present invention.

Operations for forming magnetic memory devices according to further embodiments of the present invention will be described in detail with reference to FIGS. 3 through 5. Referring to FIG. 3, a first conductive pattern 22 may be formed on a substrate 10. The substrate 10 may be a silicon-based semiconductor substrate including a conductive region and/or an insulating region. The first conductive pattern 22 may include, for example, metal, metal oxide, metal nitride, or doped semiconductor.

A guide layer 30 covering a surface of the conductive pattern 22 may be formed. The guide layer 30 may include one or more layers. For example, forming the guide layer 30 may include forming a guide magnetic layer 35 contacting the guide pinning layer 33 after the guide pinning layer 33 contacting the first conductive pattern 22 is formed.

The guide pinning layer 33 may include an anti-ferromagnetic material. For example, the guide pinning layer 33 may include at least one of PtMn, IrMn, MnO, MnS, MnTe, $FeCl_2$, FeO, $CoCl_2$, CoO, $NiCl_2$, NiO, and Cr.

The guide magnetic layer 35 may include a ferromagnetic material. For example, the guide magnetic layer 35 may include at least one of CoFeB, Fe, Co, Ni, Gd, Dy, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

A diffusion barrier 37 may be formed on the guide magnetic layer 35. The diffusion barrier 37 may include a material having a low solubility with respect to a conductive element of a subsequently formed conductive layer. For example, the diffusion barrier 37 may include at least one of Co, Cr, Ru, Ta, and Ir.

An insulating layer 43 may be formed on the diffusion barrier 37. The insulating layer 43 may include, for example, an oxide, a nitride, a chalcogen compound, or a combination thereof. The insulating layer 43 may have an undensified crystalline structure. For example, the insulating layer 43 may include a spin on glass (SOG) oxide. The insulating layer 43 may include a first surface facing the guide magnetic layer 35 and a second surface opposite to the first surface.

A conductive layer 44 may be formed on the insulating 43. The conductive layer 44 may include a conductive element having a standard reduction potential greater than that of hydrogen. For example, the conductive layer 44 may include at least one of Cu, Ag, Au, Pt, Ti, Ru, and Ir. The conductive layer 44 may be deposited on the insulating layer 43.

Figure 4:
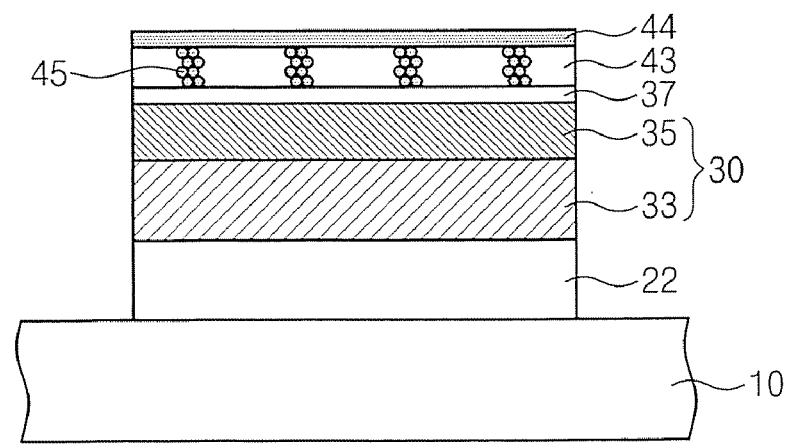

Referring to FIG. 4, conductive bridges 45 may be formed by moving a portion of a conductive element of the conductive layer 44 into the insulating layer 43. One end of the conductive bridges 45 may be electrically connected to the guide layer 30. When a diffusion barrier 37 is interposed between the insulating layer 43 and the guide layer 30, the end of the conductive bridges 45 may be electrically connected to the guide layer 30 through the diffusion barrier 37.

The conductive bridges 45 may be formed by a diffusion of the conductive element. When the conductive layer 44 is deposited on the insulating layer 43, the conductive element may be diffused into the insulating layer 43 through energy provided for the deposition.

As described above, the conductive bridges 45 may be formed by moving the conductive element. Accordingly, it is not necessary to perform a photolithography process during the formation of the conductive bridges 45. As a result, fabrication may be simplified.

The conductive bridges 45 may be formed by providing the first and second surfaces of the insulating layer 43 with different voltages to create a potential difference across the insulating layer 43. For example, a first voltage may be applied to the first surface, and a second voltage greater than the first voltage may be applied to the second surface. Thus, at least portion of the conductive element in the conductive layer 44 may be converted into cations, which may be moved to the first surface. In this case, electrons may be provided from the first surface, and combined with the cations of the conductive element. Subsequently, the conductive bridges 45 may be formed. The first voltage may be supplied through the diffusion barrier and/or the guide layer 30, and the second voltage may be supplied through the conductive layer 44. The first and second voltages may be supplied through the edge of a wafer immediately after the conductive layer 44 is formed. Alternatively, after the magnetic memory device is completed, the conductive bridges 45 may be formed by applying the first and second voltages to the first and second conductive patterns in FIG. 1 or 2. The width W and/or number of the conductive bridges 45 may be determined by the magnitude of the supplied voltages. Thus, the process reproducibility may be secured.

Ultraviolet (UV) radiation may also be used to move the conductive element in the conductive layer 44. The UV rays may facilitate the conductive element and/or the cations thereof to move into the insulating layer 43. The energy and irradiation period of the UV rays may be controlled to control the formation of the conductive bridges 45. The width and number of the conductive bridges 45 may be controlled in accordance with conditions of the irradiated UV rays.

In some embodiments, the conductive bridges 45 may be formed without a formation of the conductive layer 44. For example, the insulating layer 43 may include the conductive element. The conductive element may be substantially uniformly distributed in the insulating layer 43. The insulating layer 43 including the conductive element may be deposited on the guide layer 30. Upon deposition, the conductive element in the insulating layer 43 may be spaced from each other. That is, the conductive bridges 45 may not exist in the insulating layer 43 immediately after the deposition. First and second voltages may be applied to the first and second surfaces of the deposited insulating layer 43 to move the conductive element of the insulating layer 43 and thereby form the conductive bridges 45. The first and second voltages may be provided immediately after the insulating layer 43 including the conductive element is deposited. Alternatively, after the memory device is completed, the first and second voltages may be provided through the first and second conductive patterns 22 and 92 in FIG. 1 or 2. The conductive bridges 45 may be formed through the movement of the conductive element by the voltages. In this case, the insulating layer 43 may be formed of an insulating material including conductive element. For example, the insulating layer 43 may be an oxide including Cu, Ag, Au, Pt, Ti, Ru, or Ir.

The conductive bridges 45 may have a very fine width. The conductive bridges 45 may be formed to have a width corresponding to the sum of atomic diameters of several to several tens of atomic diameters of the conductive element. In some embodiments, the conductive bridges 45 may have a width identical to the diameter of one conductive element. The conductive bridges 45 may have a length shorter than the spin diffusion length. In order to control the length of the conductive bridge, the insulating layer 43 may be formed to have a thickness smaller than the spin diffusion length.

After the formation of the conductive bridges 45, the conductive layer 44 may be removed. The conductive layer 44 may be removed using a method that removes without significantly damaging the conductive bridges 45. For example, the conductive layer 44 may be removed through a chemical mechanical polishing (CMP) or a wet etching process. If necessary, the conductive layer 44 may not be removed.

Figure 5:
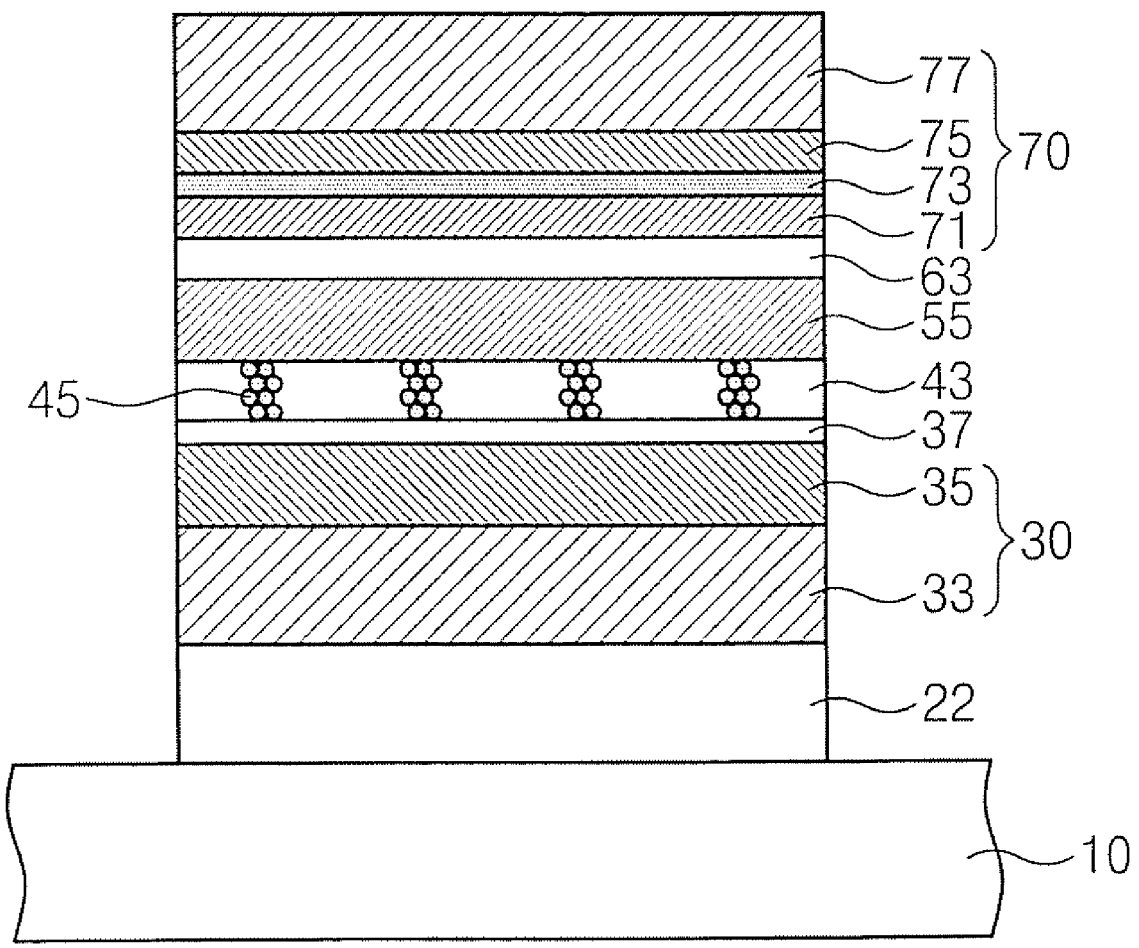

Referring to FIG. 5, a free layer 55 is formed on the insulating layer 43. The free layer 55 may be formed of a ferromagnetic layer. For example, the free layer 55 may include at least one of CoFeB, Fe, Co, Ni, Gd, Dy, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

A tunnel barrier 63 may be formed on the free layer 55. The tunnel barrier 63 may include, for example, a magnesium oxide and/or an aluminum oxide. The tunnel barrier 63 may be formed to be sufficiently thin to allow electrons to tunnel therethrough.

A reference layer 70 may be formed on the tunnel barrier 63. The reference layer 70 may include a layer having a fixed magnetization direction. For example, the reference 70 may include a reference magnetic layer 71 having a fixed magnetization direction, a non-magnetic layer 73, and an auxiliary magnetic layer 75 having a magnetization direction antiparallel to the magnetization direction of the reference magnetic layer. A reference pinning layer 77 may be further formed to fix the magnetization direction of the reference layer 70 thereon.

The reference magnetic layer 71 may include a ferromagnetic material. For example, the reference magnetic layer 71 may include at least one of CoFeB, Fe, Co, Ni, Gd, Dy, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The non-magnetic layer 73 may include Ru, and the ferromagnetic layer 75 may include at least one of CoFeB, Fe, Co, Ni, Gd, Dy, CoFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The reference pinning layer 77 may include a semi-ferromagnetic material. For example, the reference pinning layer 77 may include at least one of PtMn, IrMn, MnO, MnS, MnTe, FeCl2, FeO, CoCl2, CoO, NiCl2, NiO, and Cr.

Referring again to FIG. 1, a capping layer 82 and a second conductive pattern 92 are formed on the reference layer 70. The capping layer 82 and the second conductive pattern 92 may include a conductive material including a doped semiconductor, a metal, a metal oxide, a metal nitride, or a combination thereof.

Hereinafter, a method of forming a magnetic memory device according to further embodiments of the present invention. Details as described in FIGS. 3 through 5 will be omitted.

Figure 6:
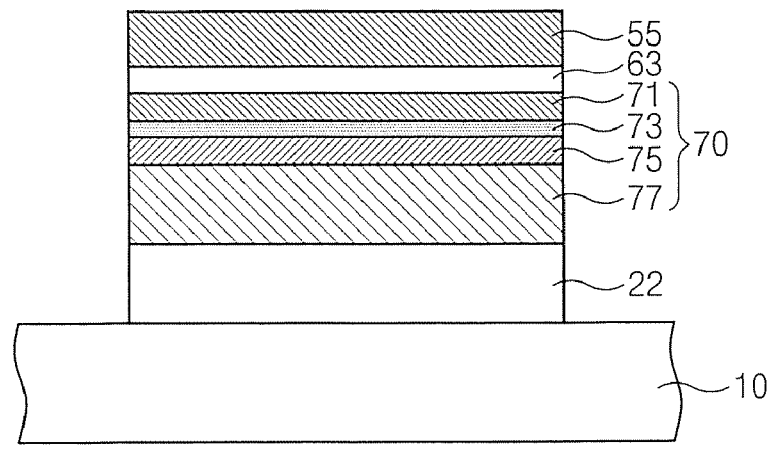
FIGS. 6 and 7 are diagrams illustrating a method of forming a magnetic memory device according to further embodiments of the present invention.

Referring to FIG. 6, a first conductive pattern 22, a reference layer 70, a tunnel barrier 63, and a free layer 55 are sequentially formed on the substrate 10. The reference layer 70 may be formed by sequentially stacking a reference pinning layer 77, an auxiliary magnetic layer 75, a non-magnetic layer 73, and a reference magnetic layer 71. The free layer 55 may include a ferromagnetic substance.

Figure 7:
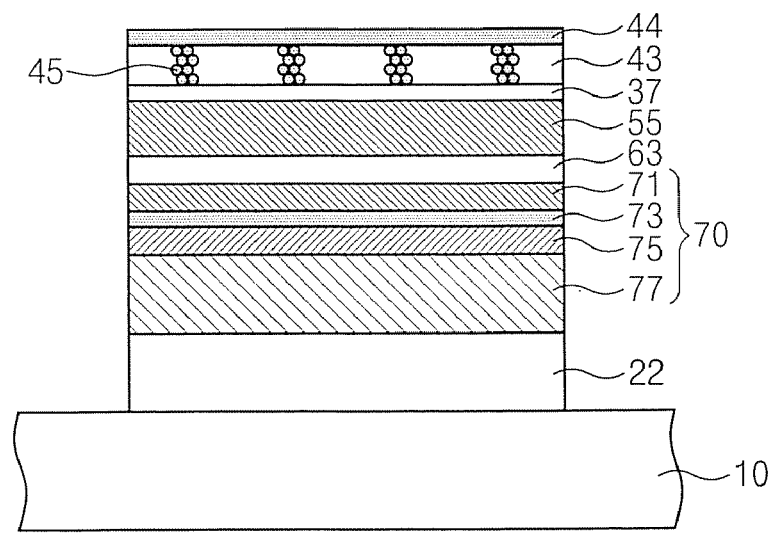

Referring to FIG. 7, a diffusion barrier 37 may be formed on the free layer 55. The diffusion barrier 37 may prevent a conductive element from diffusing into other regions of the device, which may result in deterioration of device properties. The diffusion barrier 37 may be formed prior to the formation of an insulation layer 43 in which the conductive bridges 45 is formed.

The insulating layer 43 may be formed on the diffusion barrier 37. A conductive layer 44 including the conductive element may be formed on the insulating layer 43. The conductive element may be transferred from the conductive layer 44 to the insulating layer 43 to form the conductive bridges 45.

Referring again to FIG. 2, a guide layer 30 and a second conductive pattern 92 may be formed on the diffusion barrier 37. The guide layer 30 may be formed by sequentially stacking the guide magnetic layer 35 and the guide pinning layer 33.

In the magnetic memory device according to some embodiments of the present invention, an insulting layer covering a surface of a free layer includes conductive bridges electrically connected to the surface of the free layer. The conductive bridges may have a fine width less than several tens of atomic diameters of conductive element. Thus, the switch current density can be increased to change the magnetization direction of the free layer. Accordingly, a magnetic memory device which can be driven with the reduced switching current can be provided. Also, because the conductive bridges may be formed by the movement of the conductive element, the magnetic memory device can be formed through a simpler process.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a magnetic memory device, the method comprising:
   forming one of a free layer or a guide layer on a substrate;
   forming an insulating layer on the one of the free layer or the guide layer;
   forming a conductive layer on the insulating layer; and
   moving a conductive element from the conductive layer into the insulating layer to form at least one conductive bridge passing through the insulating layer and electrically connected to the one of a free layer or the guide layer.

2. The method of claim 1, wherein forming one of a free layer or a guide layer comprises forming a free layer, wherein forming an insulating layer on the one of a free layer or a guide layer comprises forming the insulating layer on the free layer and wherein the method further comprises forming a guide layer on a second side of the insulating layer opposite the free layer and electrically connected to the at least one conductive bridge.

3. The method of claim 2, wherein the free layer and the guide layer each comprise at least one ferromagnetic material.

4. The method of claim 2, further comprising:
   forming a reference layer having a fixed magnetization direction on a side of the free layer opposite the insulating layer; and
   forming a tunnel barrier interposed between the reference layer and the free layer.

5. The method of claim 1, further comprising forming a diffusion barrier between the one of a free layer or a guide layer and the insulating layer.

6. The method of claim 1, wherein moving a conductive element from the conductive layer into the insulating layer to form at least one conductive bridge passing through the insulating layer and electrically connected to the free layer comprises applying a potential difference across the insulating layer.

7. The method of claim 1, wherein moving a conductive element from the conductive layer into the insulating layer to form at least one conductive bridge passing through the insulating layer and electrically connected to the one of a free layer or a guide layer comprises forming a plurality of conductive bridges, each having a width of less than about 100 atomic diameters of the conductive element.

8. A method of forming a magnetic memory device, the method comprising:
   forming a guide layer on a substrate;
   forming a diffusion barrier layer on the guide layer;
   forming an insulating layer on the diffusion barrier layer;
   forming a conductive layer on the insulating layer;
   moving a conductive element from the conductive layer into the insulating layer to form at least one conductive bridge passing through the insulating layer and electrically connected to the guide layer;
   removing a remaining portion of the conductive layer to expose the insulating layer having the at least conductive bridge passing therethrough;
   forming a free layer on the exposed insulating layer having the at least one conductive bridge passing therethrough;
   forming a tunnel barrier layer on the free layer; and
   forming a reference layer on the tunnel barrier layer.

9. The method of claim 8, wherein moving a conductive element from the conductive layer into the insulating layer to form at least one conductive bridge passing through the insulating layer and electrically connected to the guide layer comprises applying a potential difference across the insulating layer.

10. The method of claim 8, wherein moving a conductive element from the conductive layer into the insulating layer to form at least one conductive bridge passing through the insulating layer and electrically connected to the guide layer comprises exposing the conductive layer to ultraviolet (UV) radiation.

11. A method of forming a magnetic memory device, the method comprising:
   forming a reference layer on a substrate;
   forming a tunnel barrier layer on the reference layer;
   forming a free layer on the tunnel barrier layer;
   forming a diffusion barrier layer on the free layer;
   forming an insulating layer on the diffusion barrier layer;
   forming a conductive layer on the insulating layer;
   moving a conductive element from the conductive layer into the insulating layer to form at least one conductive bridge passing through the insulating layer and electrically connected to the free layer;
   removing a remaining portion of the conductive layer to expose the insulating layer having the at least conductive bridge passing therethrough;
   forming a guide layer on the exposed insulating layer having the at least one conductive bridge passing therethrough;
   forming a tunnel barrier layer on the free layer; and
   forming a reference layer on the tunnel barrier layer.

12. The method of claim 11, wherein moving a conductive element from the conductive layer into the insulating layer to form at least one conductive bridge passing through the insulating layer and electrically connected to the free layer comprises applying a potential difference across the insulating layer.

13. The method of claim 11, wherein moving a conductive element from the conductive layer into the insulating layer to form at least one conductive bridge passing through the insulating layer and electrically connected to the free layer comprises exposing the conductive layer to ultraviolet (UV) radiation.

* * * * *